(12) United States Patent  
Stobbs

(10) Patent No.: US 7,489,015 B2
(45) Date of Patent: Feb. 10, 2009

(54) MAGNETIC SHIELDING FOR MAGNETIC RANDOM ACCESS MEMORY

(75) Inventor: Colin A. Stobbs, Eagle, ID (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/841,228

(22) Filed: Aug. 20, 2007

(65) Prior Publication Data

US 2007/0285957 A1 Dec. 13, 2007

Related U.S. Application Data

(63) Continuation of application No. 10/631,404, filed on Jul. 30, 2003, which is a continuation-in-part of application No. 10/358,770, filed on Feb. 5, 2003, now Pat. No. 6,940,153.

(51) Int. Cl.
*H01L 31/0203* (2006.01)
(52) U.S. Cl. .................. 257/433; 257/659; 257/660; 257/E23.129
(58) Field of Classification Search ............ 257/433, 257/659, 660, 729
See application file for complete search history.

(56) References Cited

U.S. PATENT DOCUMENTS

| 4,126,287 A | 11/1978 | Mendelsohn et al. |
|---|---|---|
| 4,174,419 A | 11/1979 | Nienart |
| 4,632,250 A | 12/1986 | Ueda et al. |
| 4,670,347 A | 6/1987 | Lasik et al. |
| 4,884,235 A | 11/1989 | Thiele |
| 4,953,002 A | 8/1990 | Nelson et al. |
| 5,045,637 A | 9/1991 | Sato et al. |
| 5,061,845 A | 10/1991 | Pinnavala |
| 5,260,128 A | 11/1993 | Ishii et al. |
| 5,409,385 A | 4/1995 | Tan et al. |
| 5,565,704 A | 10/1996 | Tokuno |
| 5,591,047 A | 1/1997 | Yamada et al. |
| 5,714,936 A | 2/1998 | Regelsberger |
| 5,745,426 A | 4/1998 | Sekiyama |
| 5,902,690 A | 5/1999 | Tracy et al. |
| 5,939,772 A | 8/1999 | Hurst et al. |
| 5,940,319 A | 8/1999 | Durlam et al. |
| 6,404,647 B1 | 6/2002 | Minne |
| 6,429,044 B1 | 8/2002 | Tuttle |
| 6,452,253 B1 | 9/2002 | Tuttle |
| 6,515,352 B1 | 2/2003 | Spielberger et al. |
| 6,559,521 B2 | 5/2003 | Tuttle |
| 6,625,040 B1 | 9/2003 | Tuttle |
| 2002/0024116 A1 | 2/2002 | Tuttle |
| 2002/0050632 A1 | 5/2002 | Tuttle |
| 2003/0025180 A1 | 2/2003 | Alcoe et al. |
| 2003/0052340 A1 | 3/2003 | Tuttle |
| 2003/0132494 A1* | 7/2003 | Tuttle et al. .................. 257/433 |

FOREIGN PATENT DOCUMENTS

| DE | 10103314 A1 | 8/2002 |
|---|---|---|
| JP | 63281980 A | 11/1998 |
| WO | WO 00/06271 A1 | 2/2000 |
| WO | WO 00/72324 A1 | 11/2000 |

* cited by examiner

*Primary Examiner*—Hsien-ming Lee
(74) *Attorney, Agent, or Firm*—Myers Bigel Sibley & Sajovec, P.A.

(57) ABSTRACT

A memory assembly comprises a substrate that incorporates magnetic shielding, a magnetic random access memory die supported by the substrate, and an encapsulation matrix that includes magnetic shielding that is disposed over the magnetic random access memory die.

4 Claims, 3 Drawing Sheets

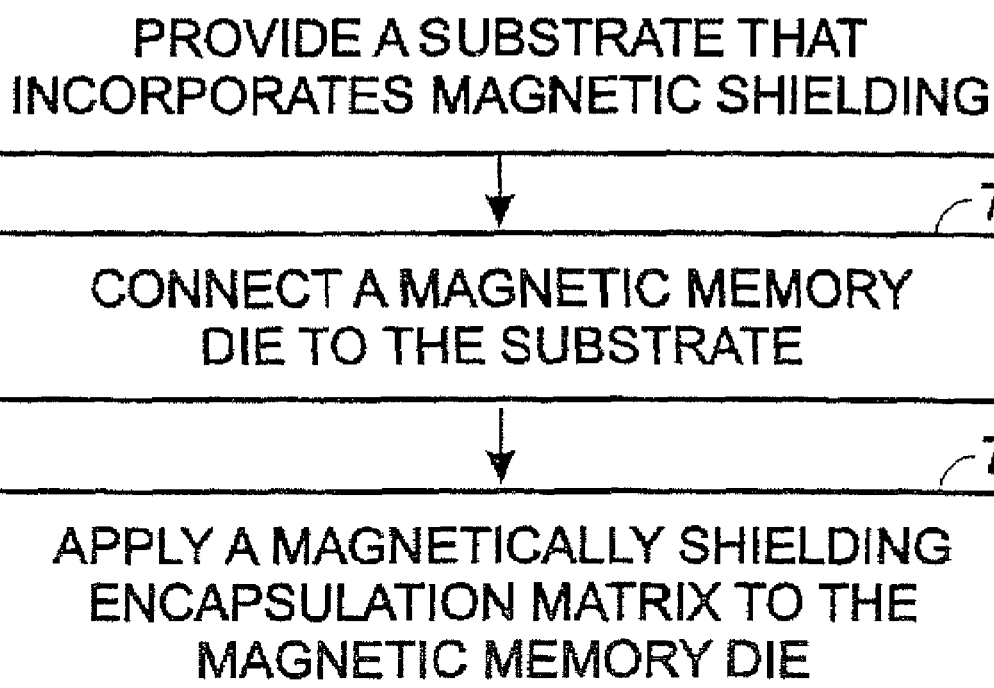

MAGNETIC SHIELDING FOR MAGNETIC RANDOM ACCESS MEMORY

REFERENCE TO PRIORITY APPLICATIONS

This application is a continuation of U.S. application Ser. No. 10/631,404; filed Jul. 30, 2003, which is a continuation-in-part of U.S. application Ser. No. 10/358,770, filed Feb. 5, 2003, now U.S. Pat. No. 6,940,153 the disclosures of which are hereby incorporated herein by reference.

BACKGROUND

There is an increasing need to make portable electronic devices smaller, more durable, and more powerful. A variety of electronic memory systems may be used in such devices, including hard drives, electronic memory, and magnetic memory. Conventional hard drives offer high memory capacity, but they are slow, unreliable and power-hungry when compared to silicon-based memory assemblies. Electronic memory assemblies, such as static random access memory chips (SRAM) and dynamic random access memory chips (DRAM), are faster and typically smaller, but the contents of the electronic memory are lost when power to the memory is interrupted.

Magnetic random access memory (or MRAM), uses magnetic, rather than electronic, charges to store bits of data. The use of MRAM chips typically improves the performance of electronic devices by permitting the storage of more information, permitting faster access to stored information, and using lower power consumption than is possible using electronic memory. In addition, MRAM chips retain information when power to the memory is turned off, meaning electronic devices incorporating MRAM chips, such as personal digital assistants, may start up instantly, rather than requiring initialization while software loads to electronic memory.

A typical magnetic memory chip, or die, includes an array of memory cells. The memory cell array may include a layer of magnetic film in which the magnetization is alterable and a layer of magnetic film in which the magnetization is fixed or "pinned" in a particular direction. The magnetic film having alterable magnetization optionally is referred to as a data storage layer or sense layer, and the magnetic film that is pinned optionally is referred to as a reference layer.

Conductive traces (commonly referred to as word lines and bit lines) are typically routed across the array of memory cells. Word lines extend along rows of memory cells, and bit lines extend along columns of memory cells. Because the word lines and bit lines operate in combination to switch the orientation of magnetization of the selected memory cell (i.e., to write the memory cell), the word lines and bit lines optionally are referred to collectively as write lines. Additionally, the write lines optionally are used to read the logic values stored in the memory cell.

Located at each intersection of a word line and a bit line is a memory cell. Each memory cell stores a bit of information as an orientation of a magnetization. The orientation of magnetization of each memory cell will assume one of two stable orientations at any given time. These two stable orientations represent logic values of "1" and "0".

The orientation of magnetization of a selected memory cell may be changed by the application of an external magnetic field. Supplying electrical current to a word line and a bit line that intersect at the selected memory cell creates the external magnetic field. The electrical currents in the word and bit lines create magnetic fields (also referred to as "write fields") surrounding the energized word and bit lines that, when combined, can switch the orientation of magnetization (and thus the logic value) of the selected memory cell.

Generally, only the selected magnetic memory cell is subjected to both the word and bit line write fields. Other memory cells coupled to the particular word line generally receive only the word line write field. The magnitudes of the word and bit line write fields are usually selected to be sufficiently high that the chosen magnetic memory cell will switch its logic state only when subjected to both fields, and low enough so that the other magnetic memory cells that are subject only to a single write field (from either the word line or the bit line) are not switched. The undesirable switching of a magnetic memory cell that receives only one write field is commonly referred to as "half-select" switching.

MRAM devices may be subject to error in the presence of stray or externally applied magnetic fields from sources other than the applied write fields. Such stray magnetic fields can originate from a multitude of sources, e.g. external electronic devices such as computers, displays, bar code readers, etc. Such magnetic fields may have a magnitude sufficient to switch the logic state of one or more memory cells in the memory cell array, even in the complete absence of a write field. The use of MRAM devices in environments that are rich in stray magnetic fields has previously been limited, due to the unacceptable levels of memory error that may result.

Memory problems arising from stray magnetic fields may be compounded as memory cell arrays become smaller, and memory cells are more densely packed into the array. Each individual memory cell becomes subjected to greater influence by the magnetic fields of adjacent memory cells and their associated write conductors, increasing the possibility that a stray magnetic field may cause the total magnetic field of an individual memory cell to be changed. It would therefore be advantageous to minimize the effects of stray magnetic fields, particularly where newer die attachment methods may permit MRAM dies to be positioned in close proximity, limiting the space available in the memory assembly for magnetic shielding.

SUMMARY

A memory assembly comprises a substrate having magnetic shielding, a magnetic random access memory die supported by the substrate, and an encapsulation matrix having magnetic shielding and enclosing the die. A circuit structure is partially encapsulated within this encapsulation matrix and is exposed on a top surface of the substrate.

BRIEF DESCRIPTION OF THE DRAWINGS

FIG. 7 is a flowchart depicting a method of making a memory assembly, according to an embodiment of the invention.

DETAILED DESCRIPTION

Figure 1:
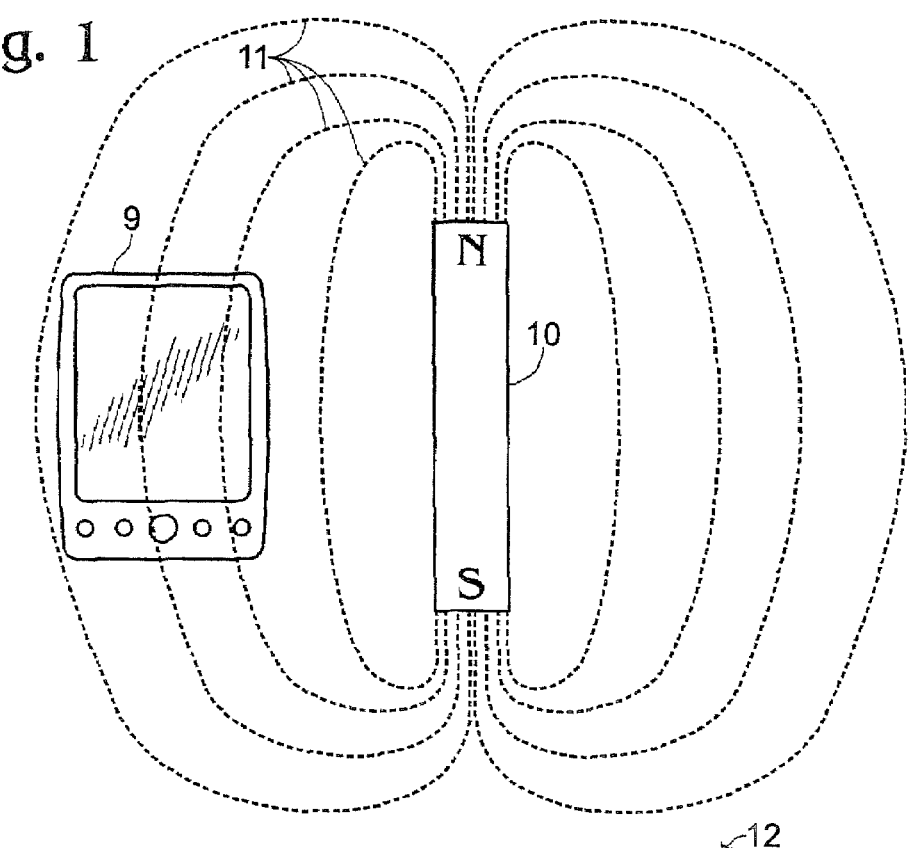
FIG. 1 illustrates an electronic device within an external magnetic field.

FIG. 1 includes an electronic device 9 that includes magnetic memory, in the presence of an externally applied magnetic field, as represented by magnet 10, and magnetic field flux lines 11. As the magnetic field of magnet 10 penetrates and passes through device 9, the magnetization states of the memory cells incorporated in device 9 may be inadvertently switched, resulting in memory error and compromising the function of the device. Although electronic device 9 is depicted as a personal digital assistant (PDA), any electronic device that utilizes magnetic memory may be similarly susceptible to memory error in the presence of an externally applied magnetic field. Electronic device 9 may include one or more magnetic memory assemblies that incorporate magnetic shielding and that are therefore at least partially shielded from the effects of stray magnetic fields, as discussed below.

Figure 2:
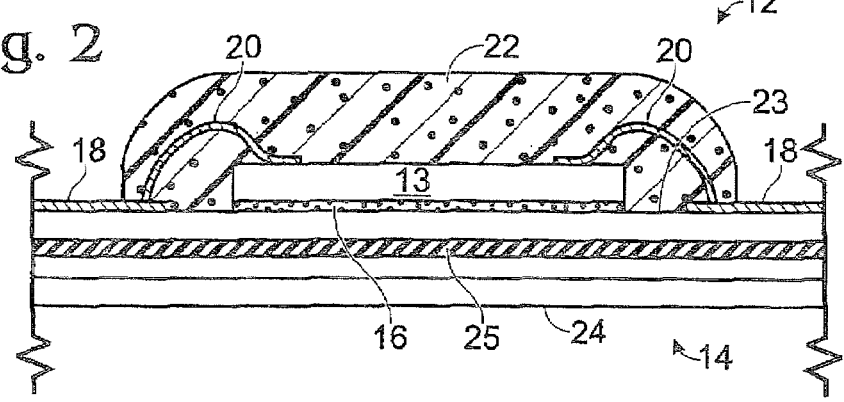
FIG. 2 is a semi-schematic cross-sectional view of a memory assembly according to an embodiment of the invention.

FIG. 2 is a schematic depiction of a memory assembly 12. Memory assembly 12 may include one or more MRAM dies 13 mounted on a substrate 14. MRAM die 13 may be directly attached to substrate 14 using an adhesive 16, such as an epoxy adhesive, for example. The input/outputs of the MRAM die may be electrically connected to one or more circuit pathways 18 printed or otherwise incorporated on or in the substrate, such as by interconnections 20. These interconnections may include wire-bonding between the die input/outputs and circuit pathways 18. MRAM die 13 may be further secured to substrate 14 by an encapsulation matrix 22 that at least substantially encloses the die.

Encapsulation matrix 22 may entirely cover the upper surface of the die, and typically at least partially covers and encloses the sides of the die as well. Where encapsulation matrix 22 substantially encloses the die, the encapsulation matrix may enhance the security of the attachment of the die to the substrate, by further fixing the die in place. Alternatively, or in addition, the encapsulation matrix may also protect the die from environmental effects, such as moisture, abrasion, and impact.

The encapsulation matrix typically comprises an electrically nonconductive compound such as, for example, epoxy resin or silicone. The encapsulation matrix may be applied to the die using suitable manufacturing techniques. For example, the encapsulation matrix may be applied via injection molding the matrix in place around the die. Alternatively, the encapsulation matrix may be applied to the die and substrate by an injection molding process, or the matrix material may be applied die directly onto the surface of the die. Further yet, the encapsulation matrix may be prefabricated and then sealed around the die. Typically the encapsulation matrix is applied as a liquid or semi-liquid that then cools or cures until solid. Encapsulation matrix 22 may also incorporate magnetic shielding material to protect the die from external magnetic fields.

Substrate 14 may be a printed circuit board or other substrate suitable for the interconnection of desired electronic components. Substrate 14 may include printed circuit pathways and/or electronic components on surface 23 of the substrate, on opposing surface 24 of the substrate, or both surfaces. The substrate may optionally include electrical connections between surfaces 23 and 24. Substrate 14 may include a plurality of discrete layers. For example, the substrate may have at least one internal layer that includes a thin film of magnetic shielding material 25. The thin layer of shielding material 25 may be formed during manufacture of the substrate, for example, by inclusion of a film of magnetic shielding material or by spraying or sputtering the material onto one of the circuit board's internal layers during manufacture of the printed circuit board.

Alternatively, or in addition to incorporating magnetic shielding as an internal layer of the substrate, magnetic shielding material may be sprayed or sputtered onto surface 24 of substrate 14 opposite surface 23 attached to MRAM die 12, surface 24 of the substrate may thereby therefore become unavailable for attaching additional electronic components. As electronic devices become more compact, the ability to utilize both sides of a substrate, such as a printed circuit board, for attachment of electronic components may become increasingly important. By incorporating the magnetic shielding within the substrate as an internal layer, both the upper and lower surfaces of the substrate remain available for electronic component attachment.

The magnetic shielding incorporated into memory assembly 12 may be distributed within the encapsulation matrix 22 or may be formed as a thin substrate layer 25, or both. The magnetic shielding material itself may be selected from a number of appropriate shielding materials, provided that the selected magnetic shielding material is capable of at least partially protecting the MRAM die from the effect of an external magnetic field.

The magnetic shielding present in the encapsulation matrix may include magnetic particles, threads or other structures or forms (collectively herein, "particles") that are incorporated into the encapsulation matrix before the matrix is applied to the MRAM die. Such particles are formed of any of a variety of materials; examples include but are not limited to iron, nickel, iron-nickel alloy, iron-nickel-molybdenum alloy, and other materials. Other types of magnetic shielding may include electrically non-conductive materials; examples include but are not limited to non-conductive magnetic oxides such as the ferrites $MnFe_2O_4$, $FeFe_2O_4$, $CoFe_2O_4$, $NiFe_2O_4$, $CuFe_2O_4$, or $MgFe_2O_4$, cobaltites, chromites, manganites and other materials. Various commercially available shielding materials also are contemplated for use, examples include but are not limited to ferromagnetic shielding materials generally, and specific shielding materials sold under the trademarks MUMETAL, PERMALLOY, and others. Both conductive and non-conductive shielding materials are contemplated, depending, for example, on proximity to integrated circuit packages or other electronics in the finished memory assembly. The specific materials and forms of application are chosen according to the properties of the specific MRAM die that is subject to encapsulation.

Similarly, the magnetic shielding material present within the substrate may include any of the materials discussed above. In one exemplary embodiment, the selected material is compatible with incorporation in the substrate as a thin layer, either by inclusion of a thin film, or by deposition onto an internal layer during manufacture.

The magnetic shielding material incorporated into the substrate and encapsulation matrix, respectively, may be selected so as to at least substantially shield the magnetic random access memory die from an externally applied magnetic field. Preferably, the encapsulation matrix provides shielding on the sides of the memory die, as well as along the top of the die, so that even magnetic flux lines that impinge upon the die substantially parallel to the planes of the substrate and the die may be prevented from altering the magnetic state of the MRAM die.

Figure 3:
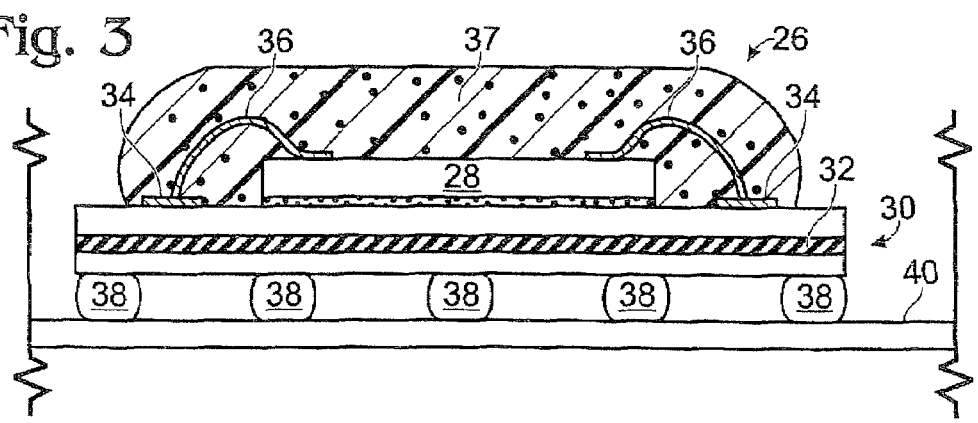
FIG. 3 is a semi-schematic cross-sectional view of a memory assembly, according to an alternative embodiment of the invention.

The shielded memory assembly described above may be incorporated into chip carrier package. Such carrier packages may facilitate the attachment of an MRAM die to a substrate. As shown in FIG. 3, a memory assembly 26 may include one or more MRAM dies 28 mounted on a substrate 30 that incorporates magnetic shielding 32. As discussed above for memory assembly 12, the MRAM die may be directly attached to the substrate using an adhesive, while the die is electrically connected to circuitry 34 by interconnections 36. The MRAM die 28 may also be secured to the substrate by an encapsulation matrix 37 that includes magnetic shielding.

However, in the case of memory assembly 26, circuitry 34 is in electronic communication with one or more carrier interconnections 38 located on the underside of substrate 30, so that the entire carrier package may be readily attached to a second substrate 40, such as a printed circuit board. Where the carrier interconnections 38 include one or more conductive solder balls, the resulting chip carrier package is referred to as a ball grid array package. Incorporation of memory assembly 26 in a ball grid array package may facilitate connections to printed circuit boards, as ball grid array packages typically provide higher pin counts in smaller areas, provide robust electrical connections via the solder balls of the package, and may be integrated into existing manufacturing processes.

Figure 4:
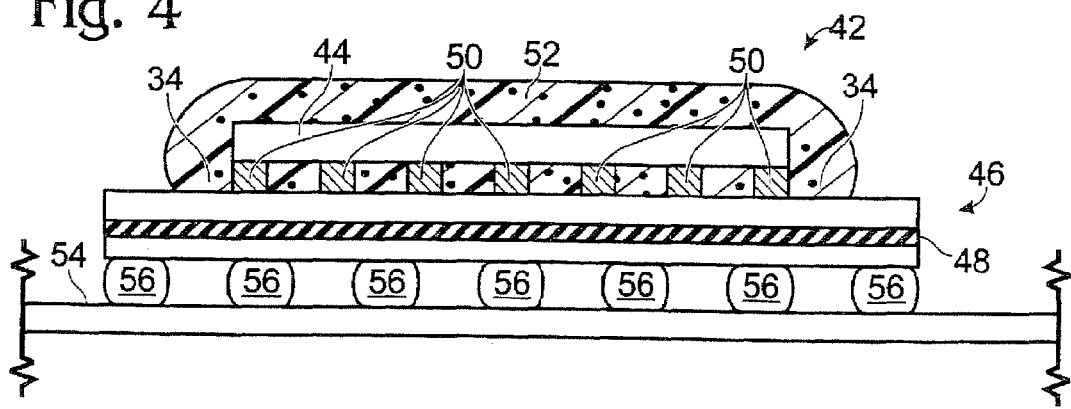
FIG. 4 is a semi-schematic cross-sectional view of a memory assembly, according to yet another alternative embodiment of the invention.

Alternatively, the shielded memory assembly may be incorporated in a chip carrier package as shown in FIG. 4. Memory assembly 42 of FIG. 4 may include one or more MRAM dies 44 that have been inverted, or flipped, such that the input/outputs of the die are directly electrically connected to substrate 46, otherwise known as a 'flip-chip' configuration. The resulting chip carrier may be referred to as a flip-chip carrier package. Substrate 46 may incorporate an internal layer of magnetic shielding 48, as described above. In addition to the electrical connections 50 between die 44 and substrate 46, the die may be additionally secured by an encapsulation matrix 52 that may include magnetic shielding. Electrical connections 50 may include solder balls, or they may include micro-vias, for example, such as may be manufactured by the formation of metal pillars on substrate 46, followed by application of a dielectric coating, and polishing to expose the top surfaces of the pillars. Similar to the ball grid array package of FIG. 2, the flip-chip package may be electrically attached to a substrate 54 via one or more electrical connections 56, which may include solder balls or other suitable conductive contact. Substrate 46 may include a plurality of electrical connections between selected input/outputs 50 and corresponding connections 56 (not shown). These connections may include conducting vias within the substrate, or another suitable electrical connection structure.

Figure 5:
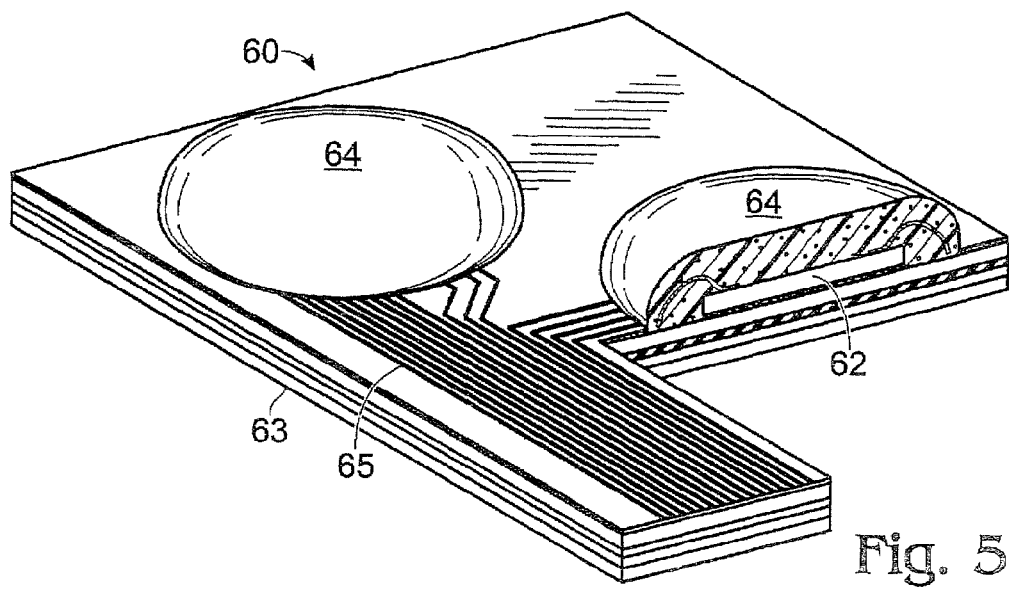
FIG. 5 is a perspective, cut-away view of a memory assembly that includes multiple memory dies with individual encapsulation matrices.
Figure 6:
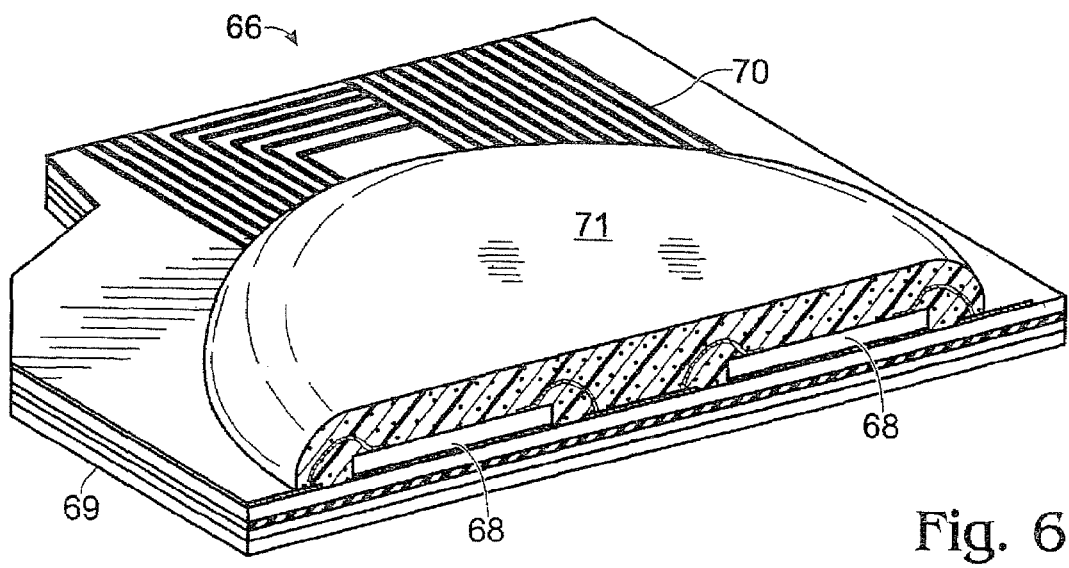
FIG. 6 is a perspective, cut-away view of a memory assembly that includes multiple memory dies under a collective encapsulation matrix.

As shown in FIG. 5, a given memory assembly 60 may include a plurality of dies 62, each attached to a substrate 63 and at least partially encapsulated within individual encapsulation matrices 64. Each die may be electrically connected to a printed circuit structure 65 on the substrate. Alternatively, as shown for memory assembly 66 of FIG. 6, a plurality of dies 68 may be connected to a substrate 69, electrically connected to a printed circuit structure 70, and at least partially encapsulated within a collective encapsulation matrix 71.

The memory assembly described herein may be incorporated in an electronic device, as discussed above. Alternatively, or in addition, the memory assembly described herein may be incorporated in a removable package, such as a magnetic memory card that may be inserted or removed from an electronic device. As the memory assemblies described herein include magnetic shielding incorporated within the die substrate and encapsulation matrix, the shielding is less prone to damage by impact or abrasion, such as during removal and insertion of such a removable package.

A shielded magnetic memory assembly as described herein may be manufactured according to the method set out in flowchart 72 of FIG. 7. The illustrated method comprises providing a substrate that incorporates magnetic shielding at 74, connecting a magnetic memory die to the substrate at 76, and applying a magnetically shielding encapsulation matrix to the magnetic random access memory die so that it is supported by the substrate at 78. The die may be attached to the substrate by an appropriate adhesive, and/or by wire-bonding, soldering, or another appropriate electrical and/or mechanical connection.

While various alternative embodiments and arrangements of a magnetic memory assembly have been shown and described above, it will be appreciated by those of skill in the art that numerous other embodiments, arrangements, and modifications are possible and are within the scope of the attached claims. In other words, those skilled in the art will understand that many variations may be made therein without departing from the spirit and scope of the invention as defined in the following claims. The present description should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element or the equivalent thereof, such claims should be understood to include incorporation of one or more such elements, neither requiring, nor excluding two or more such elements.

What is claimed is:

1. An electronic device, comprising:
   a substrate having magnetic shielding;
   a magnetic random access memory die mounted on the substrate;
   an encapsulation matrix having magnetic shielding and enclosing the die; and
   a circuit structure extending on the substrate and being partially encapsulated within the encapsulation matrix and partially exposed outside the encapsulation matrix on a top surface of the substrate directly above the magnetic shielding therein.

2. The electronic device of claim 1, wherein the substrate incorporates an internal layer of magnetic shielding.

3. The electronic device of claim 1, wherein the die is electrically connected to the circuit structure.

4. The electronic device of claim 1, further comprising bonding wire connecting the die with the circuit structure.

* * * * *